(12) United States Patent
Choi et al.

(10) Patent No.: US 8,227,177 B2
(45) Date of Patent: Jul. 24, 2012

(54) METHOD FOR MULTIPLE IRRADIATION OF A RESIST

(75) Inventors: Kang-Hoon Choi, Dresden (DE); Klaus Elian, Bubenreuth (DE); Christoph Hohle, Bubenreuth (DE); Johannes Kretz, Dresden (DE); Frank Thrum, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 671 days.

(21) Appl. No.: 11/746,909

(22) Filed: May 10, 2007

(65) Prior Publication Data

US 2007/0264595 A1 Nov. 15, 2007

(30) Foreign Application Priority Data

May 12, 2006 (DE) .......................... 10 2006 022 361

(51) Int. Cl.
*G03F 7/20* (2006.01)
(52) U.S. Cl. ......... 430/320; 430/319; 430/394; 430/330

(58) Field of Classification Search .................. None
See application file for complete search history.

(56) References Cited

U.S. PATENT DOCUMENTS

| 5,459,013 A | * | 10/1995 | Berry et al. | ............. 430/315 |
| 5,551,584 A | * | 9/1996 | Hisa | ............................ 216/2 |
| 7,408,265 B2 | * | 8/2008 | Holscher et al. | ............. 257/797 |
| 2004/0259320 A1 | | 12/2004 | Holscher et al. | |
| 2006/0199087 A1 | * | 9/2006 | Lucas et al. | .................. 430/30 |

FOREIGN PATENT DOCUMENTS

EP 0 810 477 A2 12/1997

OTHER PUBLICATIONS

Widmann, et al., "Technologie hochintegrierter Schaltungen," Semiconductor Electronics, 1996, p. 106, Springer, Berlin, Germany. (English translation attached).

* cited by examiner

*Primary Examiner* — Daborah Chacko Davis
(74) *Attorney, Agent, or Firm* — Slater & Matsil, L.L.P.

(57) ABSTRACT

The invention relates to a method with contrast reversal which, inter alia, opens up new areas of application for resists.

26 Claims, 6 Drawing Sheets

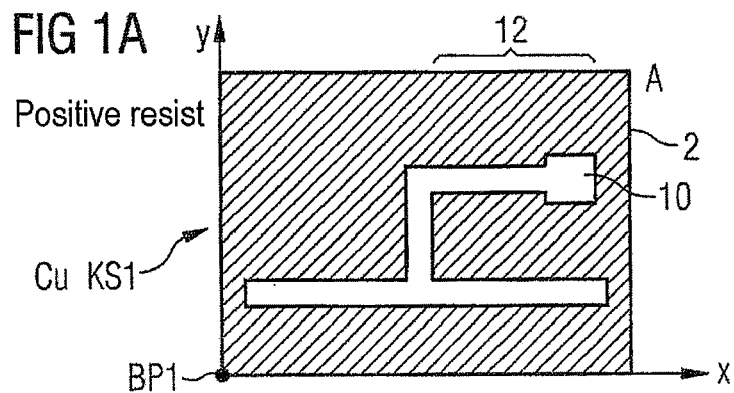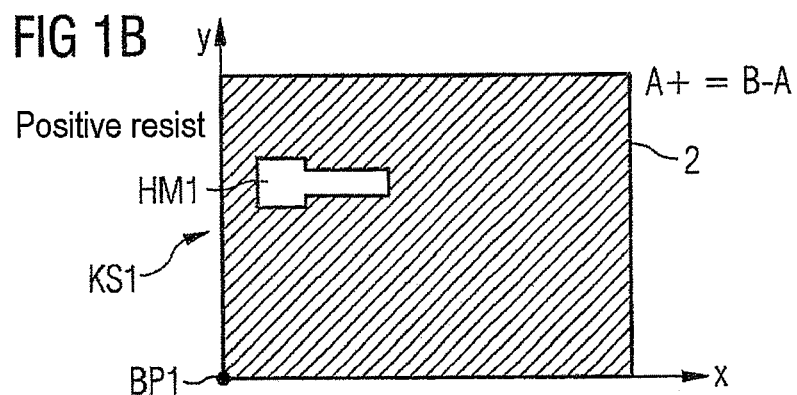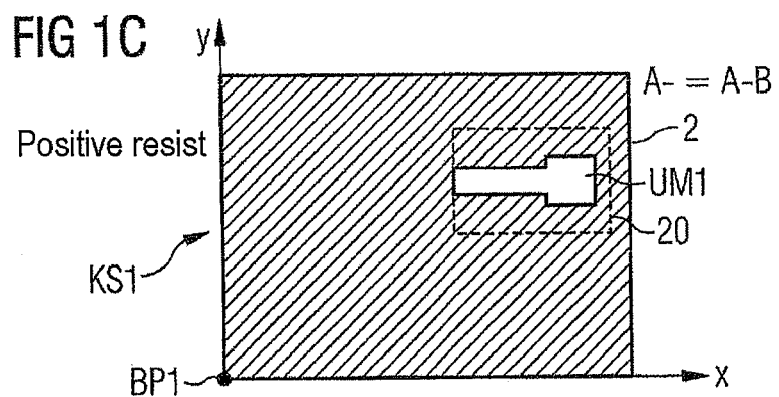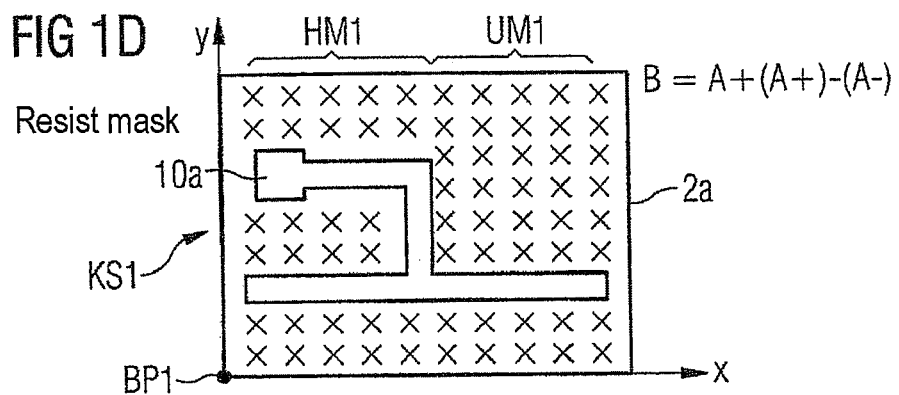

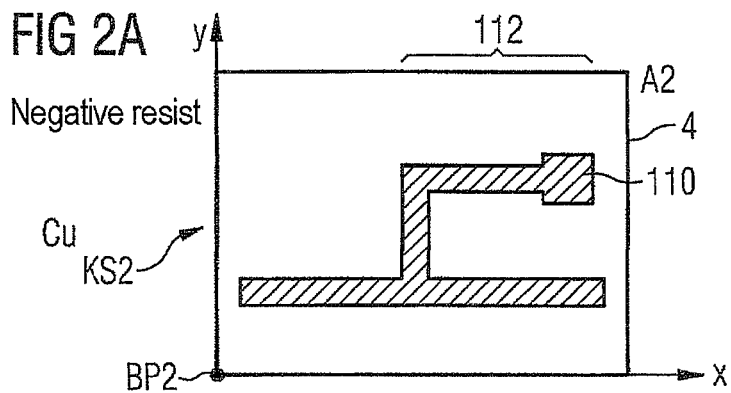
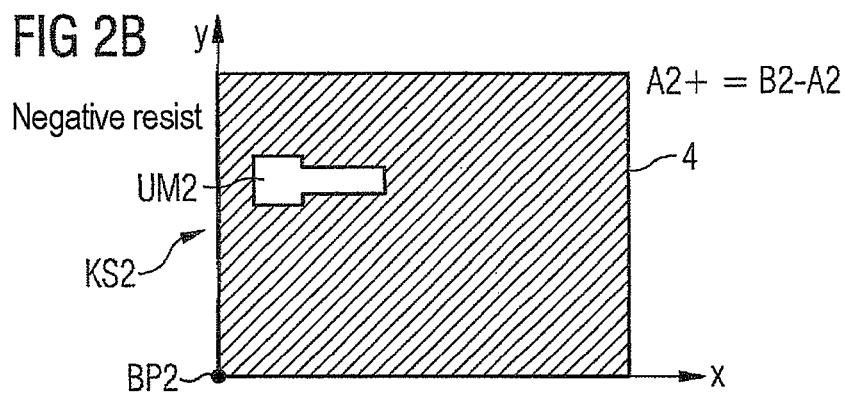
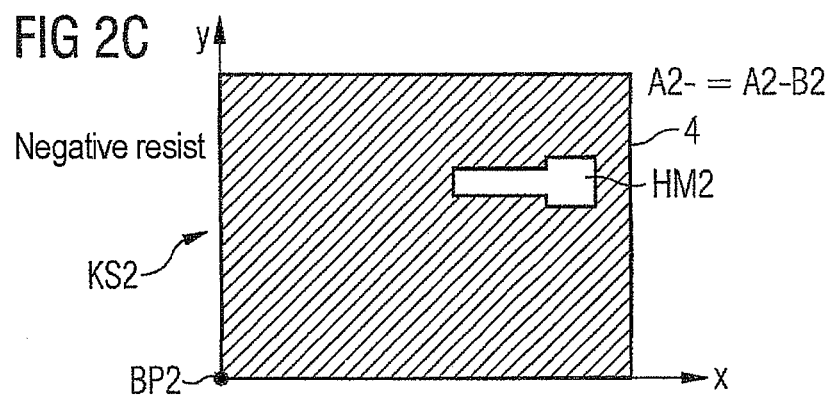
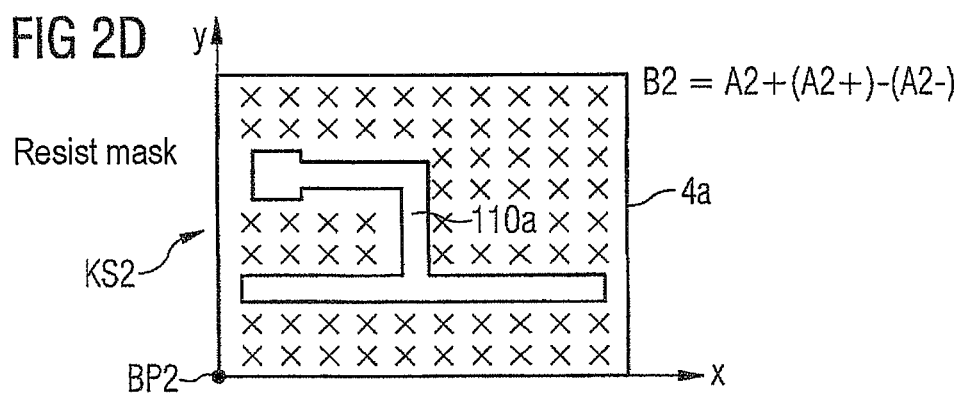

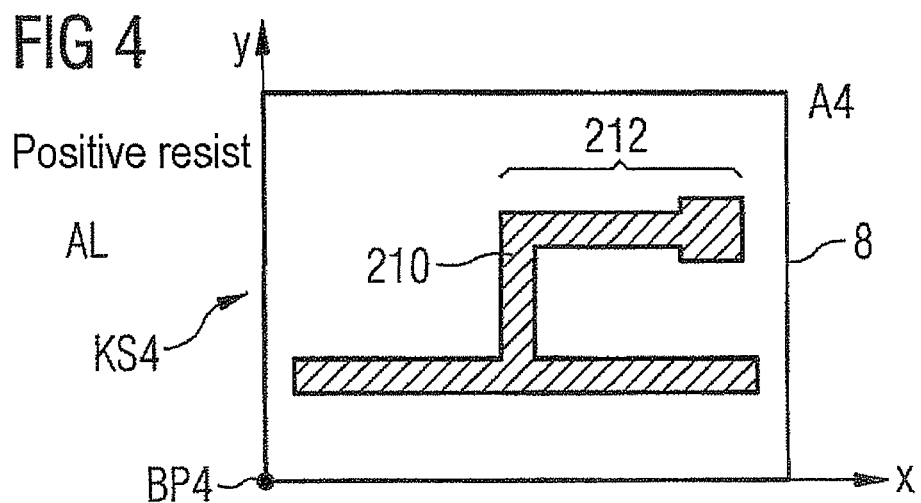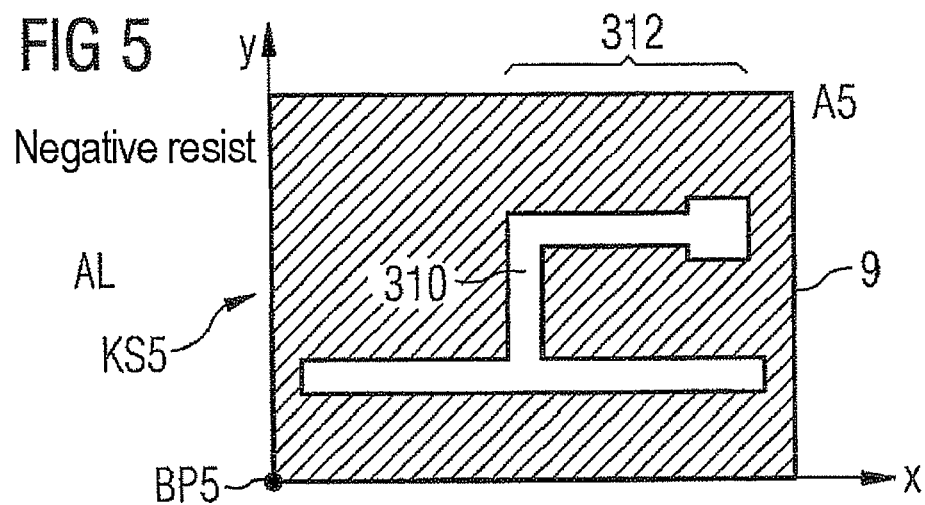

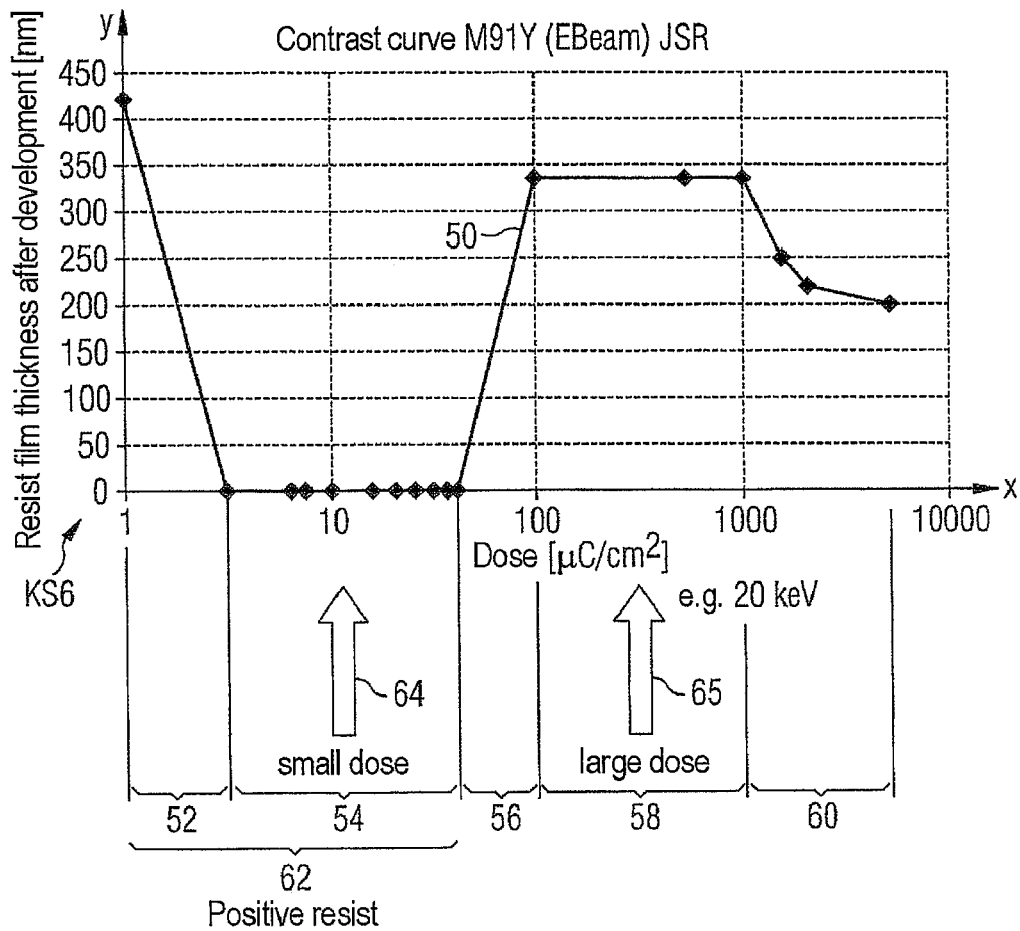
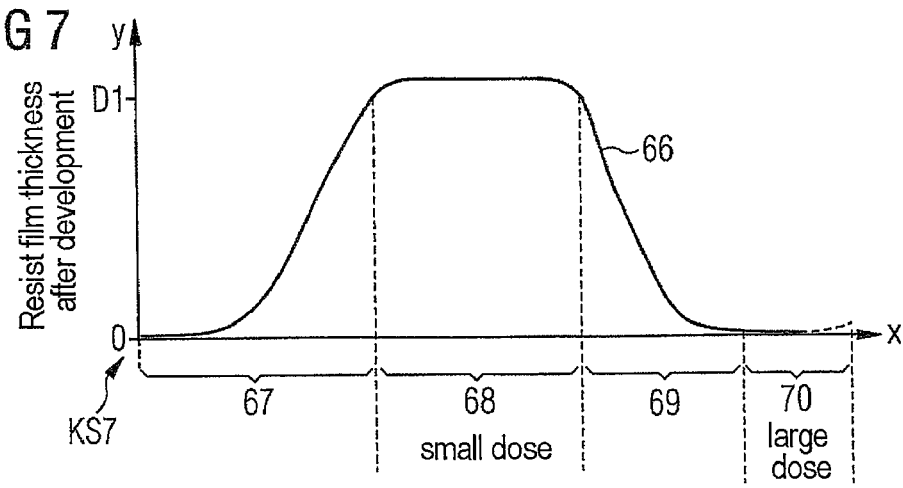

METHOD FOR MULTIPLE IRRADIATION OF A RESIST

This application claims priority to German Patent Application 10 2006 022 361.6, which was filed May 12, 2006, and is incorporated herein by reference.

TECHNICAL FIELD

The invention relates to a method for irradiation of a resist, in which a resist is applied to a substrate, the resist is irradiated, for example, with a mask in accordance with a normal dose or basic dose, and the resist is developed.

BACKGROUND

"Normal dose" means, in the case of a positive resist, that the irradiated regions are free of resist after development and, in the case of a negative resist, that the unirradiated regions are free of resist.

SUMMARY OF THE INVENTION

An embodiment of the invention specifies a simple method for irradiation of a resist which, in particular, opens up new possibilities for application of resists.

In an embodiment of the invention, a resist suitable for contrast reversal is used. With regard to the term contrast, reference is made, e.g., to Widmann, "Technologie hochintegrierter Schaltungen" ["Technology of large scale integrated circuits"], $2^{nd}$ edition, Springer, page 106. "Resist with contrast reversal" means a resist whose resist thickness dependence after development on the radiation dose is such that the contrast curve falls in one range and rises in another range.

"Contrast reversal dose" means, in the case of a positive resist, that the irradiated regions are not free of resist after development and, in the case of a negative resist, that the irradiated regions are free of resist, the contrast reversal dose being significantly greater than the normal dose in both cases.

In an embodiment of the invention, the following steps are performed: before or after the irradiation of the resist with the normal dose, irradiation of the resist preferably with a pattern generator explained in more detail below in accordance with a contrast reversal dose; and development of the resist. Wherein during the development either the resist is removed from the substrate in the region irradiated with the normal dose, as in the case of a positive resist process, and at the same time the resist remains on the substrate in the region irradiated with the contrast reversal dose; or the resist remains on the substrate in the region irradiated with the normal dose, as in the case of a negative process, and at the same time the resist is removed from the substrate in the region irradiated with the contrast reversal dose.

According to an embodiment of the invention, the resist is multiply irradiated, namely using the mask and using a pattern generator. Numerous new possibilities for application arise, which are explained in more detail below.

A positive resist is irradiated with the normal dose using the mask such that the irradiated regions are removed from the substrate during development, as is typical for positive resists. However, a contrast reversal takes place in the regions irradiated with the contrast reversal dose with the pattern generator, as a consequence of which contrast reversal of the regions remain on the substrate during development.

A negative resist is irradiated with the normal dose using the mask such that the irradiated regions remain on the substrate during development, as is typical for negative resists. However, a contrast reversal takes place in the regions irradiated with the contrast reversal dose, as a consequence of which contrast reversal of the regions are dissolved from the substrate during development.

The contrast reversal thus enables, e.g., the correction of patterns that have been produced with the mask, in particular regions irradiated with the mask can be excluded or deleted again from the pattern produced with the mask.

The masks, for example, have regions that are transmissive to the irradiation and regions that are opaque to the irradiation. As an alternative, however, phase masks or other masks are also used for carrying out the method according to an embodiment of the invention. The masks are produced in permanent and invariable fashion.

By contrast, the pattern generator makes it possible to produce a pattern depending on electronic data without using a fixed mask, in particular by: performing a scanning movement during the irradiation, e.g., with a highly focused beam, the intensity of which has, e.g., the profile of a so-called Gaussian bell; varying the transmissivity of pixel regions of a mask that can be varied depending on the data; and varying the aperture of a slot mask depending on the data.

The following combination, may be used in various embodiments:

exposure of one pattern with the normal dose and another pattern with the contrast reversal dose using an optical radiation, e.g., DUV (deep ultraviolet), the contrast reversal dose preferably being considerably greater than the normal dose, e.g., at least twice as great, so that the contrast reversal can be effected in the resist;

exposure with the normal dose using an optical radiation, e.g., DUV, and production of the contrast reversal dose using a particle radiation, e.g., electron radiation;

irradiation with the normal dose using a particle radiation, e.g., electron radiation, and optical radiation, e.g., DUV, and production of the contrast reversal dose using an optical radiation, e.g., DUV; and irradiation with the normal dose and the contrast reversal dose using a particle radiation, e.g., electron radiation, the contrast reversal dose preferably being considerably greater than the normal dose, e.g., at least twice as great, so that once again the contrast reversal can be effected in the resist.

In one embodiment, the following step is also performed:

irradiation of the resist with the pattern generator in accordance with a further normal dose or small dose, which, in one configuration, is less than the contrast reversal dose;

wherein, in the case of the first alternative, the resist is removed from the substrate during development in the region irradiated with the further normal dose, as in the case of a positive resist process;

or wherein, in the case of the second alternative, the resist remains on the substrate during development in the region irradiated with the further normal dose, as in the case of a negative resist process.

As a result, it is possible, in particular also to supplement or to modify a pattern produced with a mask. In particular, it is thus possible both to add something to the pattern and to remove parts from the pattern. In configurations, the irradiations in accordance with contrast reversal dose and further normal dose are carried out with the same type of irradiation, preferably in one pass of the pattern generator. As an alternative, however, mutually different types of radiation are also used for the contrast reversal dose and for the further normal dose.

In one embodiment, a correction pattern for the pattern produced with the mask is produced with the pattern generator. The correction pattern is changed at least once depending on the test result on an integrated test circuit for the production of which the method is used. If a functional integrated circuit is finally present, then a decision can be made, depending on the numbers required, as to whether a corrected mask is to be produced or whether a pattern generator is also used in the production of the integrated circuits which are then supplied to the end customers.

In another embodiment, when an electrical property of the circuit produced with the optical mask is not as desired or defective, a changed layout is used without the use of a modified mask but rather only as with the described method with additional use of a pattern generator and the original fixedly predetermined mask for circuit fabrication. If the layout is also verified in silicon, that is to say if the electrical function is as desired, then a mask is ordered for mass production with the defect-free layout.

In a next embodiment, the normal dose is produced with an electromagnetic radiation, in particular in the:

NUV range (near ultraviolet), e.g., with a wavelength of 436 nm (g-line) or of 365 nm (i-line), or DUV range (deep ultraviolet), i.e., a range with a wavelength of 100 nm to 300 nm, e.g., with a wavelength of 193 nm (ArF) or 248 nm (KrF).

The technology for using electromagnetic radiation and masks is particularly developed, reliable and guarantees a high wafer throughput. However, in the future other wavelengths can also be used, e.g., X-ray radiation, e.g., in the range of 0.5 nm to 20 nm, in which case more specifically the term EUV radiation (extreme ultraviolet) is also used in the jargon if the wavelength is, e.g., 13.5 nm.

As an alternative, however, a particle radiation is also used for writing the normal dose to the resist, e.g., an ion radiation using a so-called stencil mask.

In another embodiment the contrast reversal dose is a particle radiation, e.g., an electron radiation or an ion radiation. In particular, there are already resists which are suitable for electron radiations. The structure of a resist can be influenced in particularly lasting fashion with particle radiations, which facilitates the contrast reversal, in particular. However, as an alternative, an electromagnetic radiation is also used for writing in the contrast reversal dose.

In one embodiment, the further normal dose is produced with an electromagnetic radiation or a particle radiation. By way of example, a laser beam can be used for writing in the further normal dose or the contrast reversal dose.

In one embodiment, the resist is a positive resist, reference being made to the normal dose. In an alternative embodiment, the resist is a negative resist, reference once again being made to the normal dose.

The patterns correspond, e.g., to interconnects, vias, gate electrodes or active regions, e.g., source regions, drain regions, emitter regions or the like.

To summarize, it holds true that the invention and its developments make it possible to carry out resist pattern corrections and optimizations corresponding to layout changes more rapidly and more cost-effectively. In the course of transferring a new product into production, the design of an integrated semiconductor circuit often has to be corrected, often with regard to incorrect wiring, e.g., with regard to BEOL levels (Back End Of Line). The following steps have to be carried out for this purpose:

finding the incorrect wiring part (metal and/or contact/via level);

correcting the layout and the netlists;

carrying out the required verification steps before releasing the mask data or so-called "Tape Out";

releasing the mask data;

ordering the mask from a mask manufacturer;

finally use of the corrected mask/masks for irradiation of wafers.

These steps during the correction of BEOL planes or levels are also referred to as metal fix. The method steps may also be required more than once until the correct design or layout is used. The process requires time, e.g., to wait for the delivery of the mask, and costs, in particular mask costs. An embodiment of the invention and its developments make it possible to reduce both the time to attain the first functioning chip and the mask costs in the course of transferring a product into production.

As an alternative, a so-called FIB (Focused Ion Beam) repair could be used, which is used to overcome the additional time and additional costs of the mask-based metal fix. However, FIB repair is very time-consuming and can only be carried out for one chip or a small number of chips and for a very small number of interconnects that are to be severed or connected. If more chips are required for test purposes, it is necessary to carry out a mask-based correction, which is also known as a metal fix. This requires additional time and additional money.

By way of example, if a complete electron irradiation of a corrected BEOL level were effected with the pattern generator, then the problems would be solved without having to produce a mask. However, e.g., the maskless electron irradiation of a complete wafer would take a very long time. By way of example, for a minimum feature size of 130 nanometers (130 nanometer node) and for a 200 millimeter wafer, a metal level would require an electron beam writing time of about 50 hours, assuming a resist sensitivity of about 10 microcoulombs per square centimeter and a conventional electron beam writer. The total writing time depends on the density of the patterns in the layout. If, however, rather than writing the corrected layout as a whole with the electron beam, only the small difference with respect to the original pattern is written, the writing time can be drastically reduced.

It should be assumed that the layout is provided as a geometrical representation in a layout data file, e.g., GDSII (Graphic Data System II, widespread industry standard nowadays). However, it is also possible to use other layout formats, e.g., CIF (Common Intermediate Format), DXF (Drawing Exchange Format), Open Data Based, Oasis, etc. The steps I and II explained below are performed, for example, in the correction of a basic pattern:

I) Predefinition of an original layout A and a corrected layout B. With the aid of the Boolean operation "−" (minus or AND((NOT))(operation)), two new layout parts A+ and A− are produced, in which case, for the correction of A that is to be effected later, the layout part A+ is to be added to the layout A and the layout part A− is to be subtracted from the layout A. The Boolean operations can easily be carried out with available software for data preparation. Consequently, the following hold true:

Layout $A+$=Layout $B$−Layout $A$;

Layout $A-$=Layout $A$−Layout $B$.

II) Irradiation of the wafer:
a) e.g., optically with the mask in accordance with layout A and with normal dose;
b) e.g., with an electron beam irradiation having a low dose with layout A+;
c) e.g., with an electron beam irradiation having a high dose with layout A−;
d) development of the resist.

These method steps are explained in more detail below for positive resists and negative resists. The order of method steps a) to c) can be varied. By way of example, method steps b) and c) are carried out before method step a). It is also possible, by way of example, for method steps b) and c) to be carried out simultaneously or in one scanning pass.

Depending on the resist used and on the method used for patterning, e.g. additive or subtractive methods, a high dose is also used in step b) and a low dose is also used in step c).

Consequently, the basic principle wherein the same resist is used both for optical irradiation and for the additive irradiation with the electron beam and for the subtractive irradiation with the electron beam is utilized, for example. The additive irradiation and the subtractive irradiation by the electron beam are possible by choosing different electron irradiation doses in order to make the resist soluble or insoluble in the developer solution. In this case, it is possible to use DUV resists, in particular. However, it is also possible to employ other resists.

It is assumed, for example, that the irradiation of layout A or of layout B requires ten hours of electron beam irradiation time per wafer if a specific electron beam resist with a sensitivity of 10 microcoulombs per square centimeter is irradiated. It is furthermore assumed that $1/1000$ of the pattern area must be corrected, which is highly conservative, that is to say that usually less than $1/1000$ of the layout must be corrected. When writing a layout difference, e.g., for a 100 nm technology or less with an electron beam using an electron beam resist, ten hours/1000=0.01 hour of electron beam time would be required with 10 microcoulombs per square centimeter. During the method, however, use is made, e.g., of an optical resist which has a high sensitivity for the optical irradiation and a lower sensitivity for the electron irradiation in comparison with electron beam resists. The reduced sensitivity increases the irradiation time, e.g., by a factor 100 to one hour if the sensitivity of the optical resist for electron beams is 1000 microcoulombs per square centimeter, that is to say is likewise increased by a factor 100. Instead of ten hours when irradiating the complete layout with the electron beam, only one hour is then required if only the difference forms are irradiated with the electron beam. This yields a total time saving of 9 hours or 90 percent in this case despite the use of the resist that is comparatively unsuitable for electron beams. The time for the optical irradiation was disregarded since it is considerably shorter than the electron beam irradiation time.

BRIEF DESCRIPTION OF THE DRAWINGS

Embodiments of the invention are explained below with reference to the accompanying drawings, in which:

FIGS. 1A to 1D show a first exemplary embodiment of a metallization plane using positive resist in a damascene method;

FIGS. 2A to 2D show a second exemplary embodiment of a metallization plane or level using negative resist in a damascene method;

FIG. 4 shows a fourth exemplary embodiment of a metallization plane using positive resist in a subtractive method;

FIG. 5 shows a fifth exemplary embodiment of a metallization plane using negative resist in a subtractive method;

FIG. 6 shows the measured contrast curve of a positive resist;

FIG. 7 shows the schematically illustrated contrast curve of a negative resist;

DETAILED DESCRIPTION OF ILLUSTRATIVE EMBODIMENTS

Figure 3A:
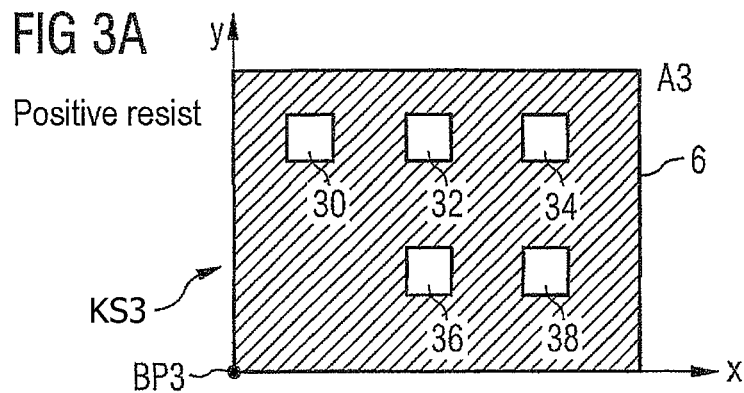
FIGS. 3A to 3D show a third exemplary embodiment for patterning a dielectric layer as via level with positive resist.
Figure 3B:
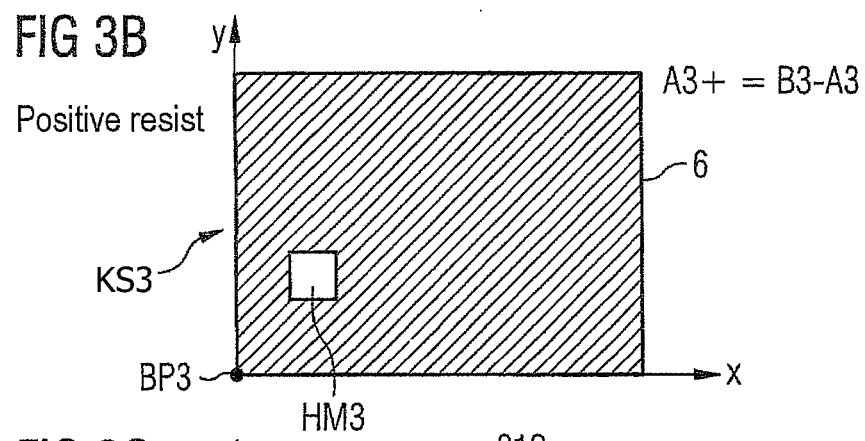
Figure 3C:
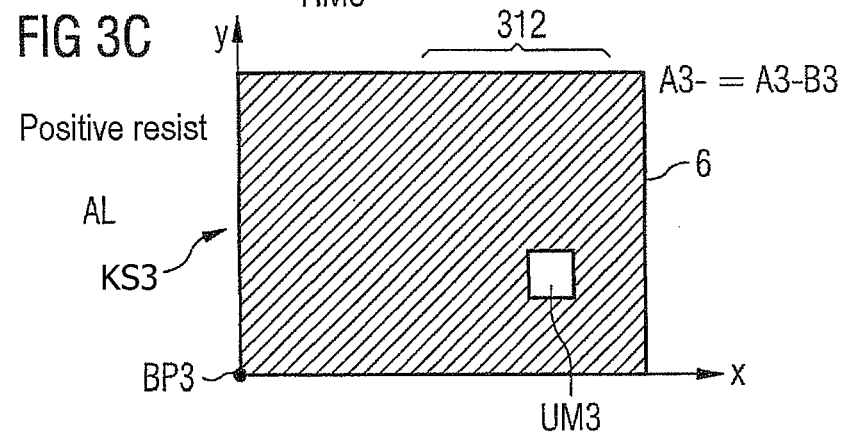
Figure 3D:
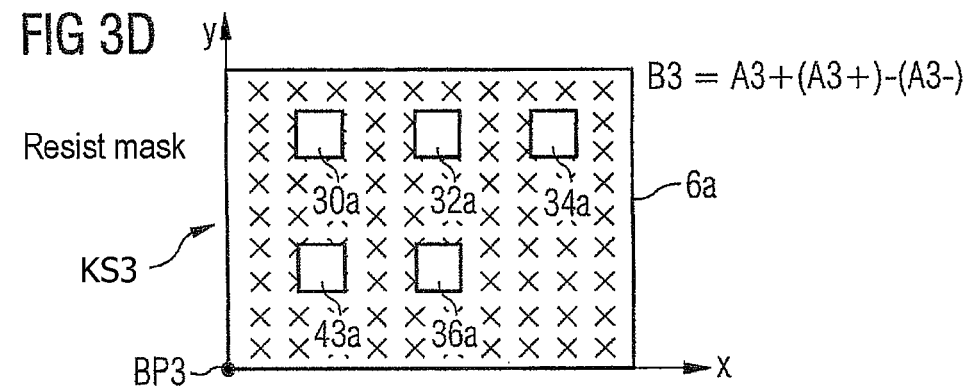

FIGS. 1A to 1D show a first exemplary embodiment using a positive resist 2 for the patterning of a dielectric layer as interconnect level, for example a copper level with the aid of a single damascene method or with the aid of a dual damascene method. FIGS. 1A to 1D all refer to a system KS1 of Cartesian coordinates which has an x axis and a y axis. The x axis and the y axis intercept at a coordinate origin lying at a fixed reference point BP1. The position of the reference point BP1 in the substrate is explained in more detail below with reference to FIG. 8, which illustrates a section through a substrate. The reference point remains at the same location for all of FIGS. 1A to 1D.

FIG. 1A illustrates in the positive resist 2 a part of an original layout A, which is imaged into the positive resist 2 with a mask using a normal dose. An interconnect pattern 10 has the form of a rotated letter "T". The interconnect pattern 10 contains a horizontal section lying in the x direction. Precisely between the two ends of the horizontal section, one end of a vertical section extending in the y direction lies in a manner adjoining the horizontal section. A partial pattern 12 lies at the other end of the vertical section of the interconnect pattern 10, which partial pattern extends from the vertical section toward the right in the x direction and is widened at its right-hand end, so that, for example, a via can be connected there. In the exemplary embodiment, the interconnect pattern 10 and the partial pattern 12 are produced in the positive resist 2 with the aid of the mask and a DUV irradiation, the solubility of the positive resist in relation to the developer used later for development being reduced in the irradiated regions. The hatched area illustrated in FIG. 1A is shaded, i.e., not irradiated, during irradiation with the mask. The interconnect pattern 10 and hence also the partial pattern 12 are irradiated, however, these being shown as unhatched or white in the illustration. The original layout A contains a defect, however, consisting in the fact that the partial pattern 12 is not intended to point toward the right, but rather toward the left, according to layout B (see FIG. 1D).

In order to eliminate the defect, therefore, a correction layout A+ is calculated which is to be added to the layout A. The layout A+ is calculated from the layout A and a corrected layout B, which is explained in more detail below with reference to FIG. 1D, according to the following formula:

$$A+=B-A,$$

where, according to the geometrical definition of the minus operation, the area A+ only contains the parts of B which do not lie in A.

FIG. 1B shows the image of layout A+ in the positive resist 2. The layout A+ contains an auxiliary pattern HM1, one end of which lies at the free end of the vertical conductive structure. The auxiliary pattern HM1 extends toward the left and ends in a widened region. In the exemplary embodiment, the auxiliary pattern HM1 is written to the positive resist 2 with the aid of a moving electron beam, a small dose (also called further normal dose furtherabove) being used, see unhatched or white region in FIG. 1B. The way in which a small dose differs from a large dose is explained in more detail below with reference to FIG. 6. Accordingly, the regions shown hatched in the illustration in FIG. 1B are not irradiated during the irradiation with the electron beam having a small dose.

In order to eliminate the defect, a correction pattern A− is additionally calculated, which specifies regions that are to be subtracted from the original layout A. The correction layout A− is calculated from the original layout A and from the layout B, explained with reference to FIG. 1D, e.g., according to the following specification:

$$A-=A-B.$$

FIG. 1C shows the image of layout A− in the positive resist 2. The layout A− contains, in the region to be deleted, an overlap pattern UM1 having the same form and the same position as the partial pattern 12. During irradiation with the electron beam, the overlap pattern UM1 is irradiated with a high dose, whereby that region of the partial pattern 12 in the positive resist 2 which has already become soluble during the irradiation in accordance with FIG. 1A is crosslinked again, and consequently becomes insoluble, see white region in FIG. 1C. The region which has not been irradiated with the electron beam having a high dose is shown hatched in the illustration in FIG. 1C.

As is illustrated in FIG. 1C, instead of the overlap pattern UM1 it is also possible to use a different pattern, see dashed line 20, as long as it is ensured that the partial pattern 12 to be deleted is covered by the irradiation in accordance with FIG. 1C. It is thereby possible to better compensate for an offset of the patterns of different irradiations during the correction.

FIG. 1D shows the resulting resist mask 2a that arises after the development of the positive resist 2. The resist mask 2a reproduces the corrected layout B. The resist mask 2a contains a corrected interconnect region 10a in the regions in which the defect-free part of the interconnect pattern 10 and the auxiliary pattern HM1 were located. In FIG. 1D, crosses identify the area on which the resist mask 2a covers the substrate. The resist mask 2a remains on the substrate in particular in the region UM1. In the region of the defect-free part of the interconnect pattern 10 and of the auxiliary pattern HM1, by contrast, the positive resist 2 was soluble and was removed during development. Afterward, trenches are etched into a dielectric layer lying below the resist mask 2a with the aid of an etching operation, which trenches correspond to the interconnect region 10a and the auxiliary pattern HM1, and which trenches are then filled with copper, for example.

FIGS. 2A to 2D show a second exemplary embodiment using a negative resist 4 for the patterning of a dielectric layer as interconnect level, e.g., as copper level in a single damascene method or in a dual damascene method. FIGS. 2A to 2D refer to a system KS2 of Cartesian coordinates which has a horizontal x axis and a vertical y axis. The x axis and the y axis intersect at a reference point BP2, which is the same reference point for all of FIGS. 2A to 2D. The position of the reference point is explained in more detail below with reference to FIG. 8.

FIG. 2A shows in the negative resist 4 a part of an original layout A2 which is imaged into the negative resist 4 with a mask using a normal dose and which contains an interconnect pattern 110 having the same form and the same position as the interconnect pattern 10. At the free end of the vertical section of the interconnect pattern 110, a partial pattern 112 adjoins toward the right, said partial pattern corresponding to the partial pattern 12 in form and position. The interconnect pattern 110 and the partial pattern 112 are produced into the negative resist 4 with the aid of the mask and a DUV radiation, the interconnect pattern 110 and the partial pattern 112 being shaded, see hatched region in FIG. 2A. By contrast, the region that is white or shown unhatched in the illustration is irradiated with DUV radiation during the irradiation with the mask.

It is assumed in the exemplary embodiment that the original layout A2 must be corrected with regard to the partial pattern 112, in a manner in which the layout A also had to be corrected.

For the correction, a layout A2+ is calculated, which specifies regions that are to be added to the basic pattern illustrated in FIG. 2A. The layout A2+ is calculated according to the following formula:

$$A2+=B2-A2,$$

where A2 is the original layout illustrated in FIGS. 2A and B2 is a corrected layout illustrated in FIG. 2D.

FIG. 2B shows in the negative resist 4 a part of the layout A2+. The layout A2+ contains an overlap pattern UM2 in the region of the interconnect pattern 110, the overlap pattern having the same position and the same form as the auxiliary pattern HM1 explained with reference to FIG. 1B. The overlap pattern UM2 is produced in the negative resist 4 with a moving electron beam having a large dose. In FIG. 2B, regions which are irradiated with an electron beam having a high dose (contrast reversal dose) are shown unhatched or white in the illustration. By contrast, regions which have not been irradiated with the electron beam are hatched.

FIG. 2C shows in the negative resist 4 a part of a second correction pattern A2− which specifies regions that are to be removed or deleted from the original layout A2. This concerns, in the region of the interconnect pattern 110, an auxiliary pattern HM2 having the same form and the same position as the partial pattern 112. The layout A2− is calculated, e.g., according to the following formula:

$$A2-=A2-B2.$$

The auxiliary pattern HM2 is produced in the negative resist 4 during the irradiation with an electron beam, the electron beam being moved and controlled in terms of its energy such that a small dose is impressed into the negative resist 4. Thus, that region of the partial pattern 112 which is not irradiated in accordance with FIG. 2A is subsequently irradiated and thus deleted, that is to say that this region will remain on the substrate during the development of the negative resist 4, see FIG. 2D. In FIG. 2C, regions which are irradiated with an electron beam having a small dose (further normal dose) are shown unhatched or white in the illustration. By contrast, regions which are not irradiated with an electron beam having a small dose are hatched. The auxiliary pattern HM2 can also have a different form, see dashed line 20 in FIG. 1C.

FIG. 2D shows the resist mask 4a that arises after the development of the negative resist 4. The resist mask 4a is the image of the corrected layout B2. The resist mask 4a surrounds an uncovered corrected interconnect region 110a lying in regions at which the defect-free region of the interconnect pattern 110 and the overlap pattern UM2 were located. Since the defect-free part of the interconnect pattern 110 has not been irradiated and since the overlap region UM2 has been irradiated with the large dose, these regions of the negative resist 4 remain soluble in the developer and are removed during development, see white region in FIG. 2D. The remaining resist mask 4a is identified by crosses in FIG. 2D. Afterward, with the aid of an etching operation, the corrected interconnect region 110a and hence also the overlap pattern UM2 are transferred into the dielectric layer lying below the resist mask 4a. After the removal of the resist mask, interconnect material, e.g., copper or a copper alloy comprising more than 95 atomic percent of copper, is introduced into the resulting trenches.

FIGS. 3A to 3D show a third exemplary embodiment for the patterning of a dielectric layer as via level with a positive resist. In a system KS3 of coordinates with a horizontal x axis, vertical y axis and a reference point BP3, FIG. 3A shows the image of a layout A3 in a positive resist 6, into which an upper row of three via patterns 30, 32, 34 has been produced with a dark field mask, the via patterns 30, 32, 34 being lined up in the x direction. A lower row comprising two via patterns 36 and 38 were simultaneously produced with the mask, in which case, in accordance with the original layout A3, the via pattern 36 of the lower row lies below the middle via pattern 32 of the upper row and the via pattern 38 lies below the right-hand via pattern 34 of the upper row. The layout A3 is intended to be corrected, however, such that a via pattern lies on the left of the via pattern 36 and that no via pattern lies on the right of the via pattern 38 (see FIG. 3D). The same method steps that have been explained above with reference to FIGS. 1A to 1D are carried out for this correction. In this case, the via pattern 38 performs the function of the partial pattern 12. A via pattern 43a to be supplemented, see FIG. 3D, performs the function of the auxiliary pattern HM1. When carrying out the method steps, therefore, for example, the via patterns 30, 32, 34 and 36 are irradiated during the optical irradiation, and so is the via pattern 38. Afterward, however, the region of the via pattern 43a is irradiated with an electron beam having a small dose, see FIG. 3B. In the region of the via pattern 38, irradiation is then effected with an electron beam having a high dose, see FIG. 3C, overlap pattern UM3.

In another exemplary embodiment, the correction of the via patterns is carried out using a negative resist.

FIG. 4 shows a fourth exemplary embodiment using a positive resist 8 for the patterning of a metal layer as interconnect level, e.g., an aluminum level or a level containing at least 95 atomic percent of aluminum that is arranged below the positive resist 8. FIG. 4 shows a system KS4 of Cartesian coordinates with an x axis and a y axis, which intersect at a reference point BP4. A part of an original layout A4 introduced into the positive resist 8 with a mask contains an interconnect pattern 210 corresponding to the interconnect pattern 110, and a partial pattern 212 corresponding to the partial pattern 112. The correction that has already been explained a number of times is to be carried out again. For this purpose, the method steps explained above with reference to FIGS. 2A to 2C are carried out, but the positive resist 8 is used instead of the negative resist 4. At the end of the correction, a resist mask arises in the defect-free part of the interconnect pattern 210 and in the region of the overlap pattern UM2 where irradiation with the high dose was effected. In a subsequent etching step, the aluminum also remains in these regions. The positive resist is subsequently removed.

FIG. 5 shows a fifth exemplary embodiment using a negative resist 9 for the patterning of a metal layer as interconnect level, e.g., an aluminum level. FIG. 5 shows a part of an original layout A5 introduced in the negative resist 9 with a mask in a system KS5 of coordinates. The system KS5 of Cartesian coordinates has a vertical x axis and a horizontal y axis, which intersect at the reference point BP5. The original layout A5 corresponds to the layout A, see FIG. 1A. The correction already explained is to be carried out again. In this case, the method steps explained above with reference to FIGS. 1A to 1C are performed, but instead of the positive resist 2 used there the negative resist 9 crucial for FIG. 5 is used. After the development, a resist mask arises in the region of the interconnect pattern 310 and in the region of the auxiliary pattern HM1. During the subsequent etching, the interconnect to be produced is protected by the resist mask in these regions.

FIG. 6 shows as an example, the contrast curve of the positive resist M91Y from the company JSR during electron irradiation with 20 keV (kiloelectronvolts). This resist is actually provided for use as an optical positive resist, the resist being provided for irradiation in the DUV range. The contrast curve is illustrated in a system KS6 of Cartesian coordinates that has an x axis and a y axis. The dose in a range of 1 microcoulomb per square centimeter up to 10 000 microcoulombs per square centimeter is represented in logarithmic form on the x axis. The film thickness, resulting after the development, of a film having an original film thickness of about 420 nanometers is represented on the y axis. The film thickness is represented linearly in the range of 0 nanometers to 450 nanometers on the y axis. An electron beam energy of 20 kiloelectronvolts was used when recording the contrast curve 50.

The contrast curve 50 has the following ranges:

a range (not illustrated) of less than 1 microcoulomb per square centimeter, in which the thickness has a plateau at about 420 nm, so that the unirradiated resist is only subjected to a so-called dark removal;

a range 52 extending from 1 microcoulomb per square centimeter to 3 microcoulombs per square centimeter, in which range the film thickness falls from 420 nanometers to the film thickness of 0 nanometers. The range 52 is therefore a range in which the resist is incompletely removed;

a range 54 following the range 52 and extending from 3 microcoulombs per square centimeter to 60 microcoulombs per square centimeter, in which range 54 the film thickness remains at the value 0 nanometers, so that the resist is completely removed during the development;

a range 56 from 60 microcoulombs per square centimeter to 100 microcoulombs per square centimeter, in which range the film thickness rises from the value 0 nanometers to the value of 330 nanometers;

a range 58 from 100 microcoulombs per square centimeter to 1000 microcoulombs per square centimeter, in which range the film thickness remains at a value of 330 nanometers. In the range 58, e.g., a crosslinking occurs in the positive resist and makes it insoluble to the developer. By way of example, TMAH (tetramethylammonium hydroxide) or a solvent is used as the developer;

a range 60 from 1000 microcoulombs per square centimeter to 6000 microcoulombs per square centimeter, in which range the film thickness falls from the value of 330 nanometers first steeply and then more shallowly to the value of 200 nanometers, but the resist removal illustrated cannot be achieved completely on account of degradation.

The ranges 52 and 54 are the ranges typically used for positive resists. The abovementioned small dose for the pattern generator lies in the range 54, see arrow 64. The small dose preferably lies in the left-hand third of the range 54. This dose is also referred to as "dose to size".

By contrast, the abovementioned large dose lies in the range 58, see arrow 65. By way of example, the large dose preferably lies in the left-hand third of the range 58.

FIG. 7 schematically shows a contrast curve 66 of a negative resist during electron irradiation. The dose is represented logarithmically on the x axis of a system KS7 of coordinates. The film thickness of a film that results after development is represented linearly on the y axis. The contrast curve 66 has the following ranges:

a range 67, in which the layer thickness present after development rises from 0 to a value D1, for example, to a value that is less than 10 percent of a maximum value for the thickness. The range 67 contains the range that specifies a dose at which the resist layer is still completely removed, that is to say if, e.g., the negative resist is subjected to a reduced irradiation;

a range 68 following the range 67, in which range 68 the small dose is used in order to crosslink the negative resist and hence make it insoluble;

a range 69 following the range 68, in which range 69 the layer thickness falls from the value D1 to the value 0. The range 69 is therefore a transition range that is not usually used;

a range 70 following the range 69, which range 70 can also be referred to as contrast reversal range. During irradiation with a large dose in the range 70, e.g., polymer chains in the negative resist are broken up again, so that the resist becomes soluble to the developer;

a degradation range (not illustrated) following the range 70, in which degradation range the resist can no longer be used because it can no longer be readily removed from the substrate.

Figure 8:
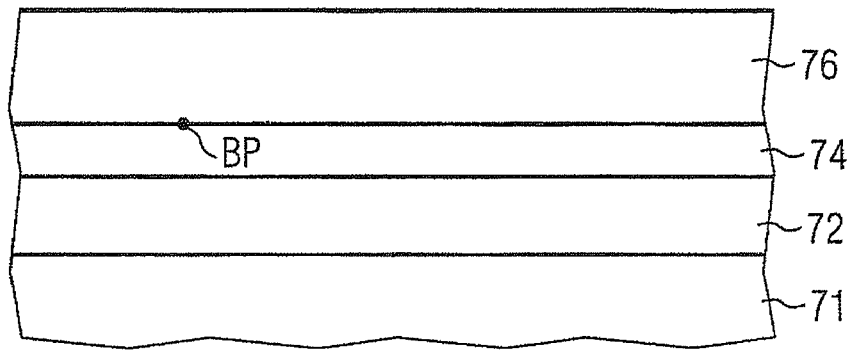
FIG. 8 shows a cross section through a substrate.

FIG. 8 shows a cross section through a substrate containing, for example, a monocrystalline semiconductor substrate, e.g., a silicon substrate 71, interlayers 72 and a dielectric layer 74 or a metal layer 74. A positive resist 76 or the abovementioned negative resist 76 is situated on the dielectric layer 74 or the metal layer 74. A reference point BP specifies the position of the reference points BP1 to BP5 of the systems KS1 to KS5 of coordinates. The reference point BP lies, e.g., precisely at the boundary between the layer 74 and the resist 76 in a plane lying at an angle of 90 degrees with respect to the plane of the drawing.

In other exemplary embodiments, the resist 76 is applied directly on the monocrystalline substrate 71, for example, for defining regions for an implantation. Corrections of basic patterns are possible in this case as well. In other exemplary embodiments, the resist 76 is applied directly to the first polysilicon layer or metal layer of a circuit and serves for the patterning of gate structures that serve for forming the gates of field effect transistors.

Figure 9:
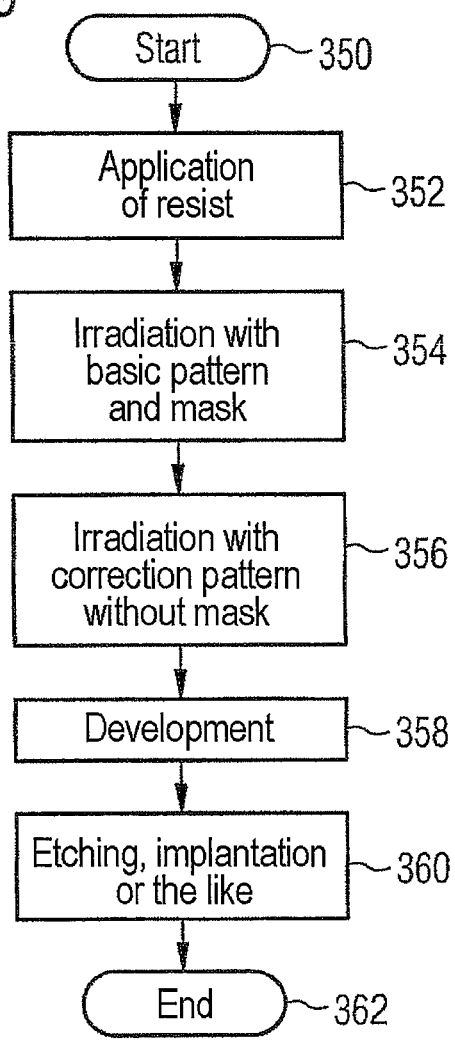
FIG. 9 shows method steps for carrying out corrections of a basic pattern.

FIG. 9 shows method steps for carrying out corrections of a basic pattern in accordance with FIGS. 1A to 8. The method begins in a method step 350. The resist 76 is applied in a method step 352 following the method step 350.

In a method step 354, the resist 76 is irradiated with a basic pattern and using a mask with the normal dose. As an alternative, the basic pattern is likewise applied with the aid of a moving electron beam and without a mask.

In a method step 356 following the method step 354, the resist 76 is irradiated with one correction pattern or a plurality of correction patterns. By way of example, correction patterns are produced with the aid of a moving electron beam. The electron beam is moved, e.g., in accordance with a raster scanning method or in accordance with a vector scanning method. The correction patterns having a high dose are produced, e.g., in the same scanning pass as the correction patterns having a small dose. As an alternative, two separate scanning passes are carried out for patterns having a high dose and patterns having a small dose.

In an alternative exemplary embodiment, the order of steps 354 and 356 is interchanged.

In a method step 358 following the method step 356, the resist is developed. Afterward, in a method step 360, the further processing is continued, for example, by etching, implantation or the like. The method is subsequently ended in a method step 362.

In a further exemplary embodiment only the correction pattern in accordance with layout A– or A2+ is produced, in each case a large dose or overdose being impressed into the resist. In other exemplary embodiments, corrections are carried out using the large dose and also using a small dose by means of the electron beam. In a next exemplary embodiment, only corrections with an electron beam that impresses a small dose into the resist are carried out.

In the case of the methods explained, both chemically amplified resists (CAR) and resists without chemical amplification can be used.

What is claimed is:

1. A method for forming a semiconductor device comprising:
    applying a positive resist to a substrate, the positive resist being capable of contrast reversal such that the positive resist is configured to be insoluble in a developer when irradiated with at least a first dose, the positive resist is configured to be soluble in the developer when irradiated with a second dose, the positive resist is configured to be insoluble in the developer without being irradiated, and wherein the second dose is smaller than the first dose;
    in one irradiation step, irradiating the positive resist with a mask in accordance with the second dose;
    before developing the positive resist, in a different irradiation step, irradiating the positive resist with a pattern generator in accordance with the first dose; and
    developing the positive resist after irradiating with the mask and the pattern generator, wherein, during the developing, first regions of the positive resist exposed with the first dose are not removed and at the same time second regions of the positive resist exposed only with the second dose are removed.

2. The method of claim 1, wherein the pattern generator produces a correction pattern for a third region of the resist comprising the first and the second regions irradiated with the mask,
    wherein the correction pattern is changed at least once, depending on a test result on an integrated test circuit.

3. The method of claim 1, wherein a circuit produced with the mask is defective or requires correction for other reasons, further comprising:
    using a changed layout comprising the pattern generator and the mask; and
    producing a modified mask, after verification of the changed layout.

4. The method of claim 1, wherein the second dose is produced with an electromagnetic radiation or a particle radiation.

5. The method of claim 4, wherein the particle radiation is an electron radiation, an ion radiation or a neutron radiation.

6. The method of claim 1, wherein the first dose is produced with a particle radiation or an electromagnetic radiation.

7. The method of claim 1, further comprising:
    using the developed positive resist as a mask, patterning a layer disposed between the positive resist and the substrate; and
    forming a conductive feature within the patterned layer.

8. The method of claim 1, further comprising:
    forming a conductive feature using the developed positive resist as an etch mask.

9. The method of claim 8, wherein the conductive feature comprises a metal or a polysilicon feature disposed over the substrate or a doped region disposed within the substrate.

10. The method of claim 1, wherein third regions of the positive resist exposed with both the first dose and the second dose are not removed.

11. The method of claim 1, further comprising:
    before the developing of the positive resist after irradiating with the mask and the pattern generator, in an additional irradiation step, irradiating a third region of the resist with the pattern generator in accordance with a third dose lower than the first dose, wherein the positive resist is removed from the substrate during the developing in the third region irradiated with the third dose.

12. The method of claim 1, wherein the irradiating of the positive resist with the mask comprises irradiating with electromagnetic radiation, and wherein the irradiating of the positive resist with the pattern generator comprises irradiating with a particle radiation.

13. A method for forming a semiconductor device comprising:
applying a negative resist to a substrate, the negative resist being capable of contrast reversal such that the negative resist is configured to be soluble in a developer when irradiated with at least a first dose, the negative resist is configured to be insoluble in the developer when irradiated with a second dose, the negative resist is configured to be soluble in the developer without being irradiated, and wherein the second dose is smaller than the first dose;
using a mask, in one irradiation step, irradiating the negative resist with the second dose;
using a pattern generator, in a different irradiation step, irradiating the negative resist with the first dose before developing the negative resist; and
developing the negative resist after the irradiating of the negative resist with the first dose and after the irradiating of the negative resist with the second dose, wherein first regions of the negative resist exposed only with the second dose are not removed and at the same time second regions of the negative resist exposed with the first dose are removed.

14. The method of claim 13, further comprising:
before the developing of the negative resist, irradiating a third region of the negative resist with the pattern generator in accordance with a third dose lower than the first dose, wherein the negative resist remains on the substrate during the developing in the third region irradiated with the third dose.

15. The method of claim 14, wherein the third dose is produced with an electromagnetic radiation or a particle radiation.

16. The method of claim 15, wherein the particle radiation is an electron radiation, an ion radiation or a neutron radiation.

17. The method of claim 13, wherein third regions of the negative resist exposed with both the first dose and the second dose are removed during the developing.

18. The method of claim 13, further comprising a forming a conductive feature using the developed negative resist.

19. A method for forming a semiconductor device comprising:
applying a positive resist over a substrate, the positive resist being capable of contrast reversal such that the positive resist is configured to be insoluble in a developer when irradiated with at least a first dose, the positive resist is configured to be soluble in the developer when irradiated with a second dose, the positive resist is configured to be insoluble in the developer without being irradiated, and wherein the second dose is smaller than the first dose;
in a first irradiation step, exposing the positive resist with a mask in accordance with the second dose, the first irradiation step forming an image of a first feature in a first region of the positive resist and an image of a second feature in a second region of the positive resist;
before developing the positive resist, in a second irradiation step, exposing the positive resist with a first pattern generator in accordance with the first dose, the second irradiation step forming an image of a third feature over the image of the first feature in the first region; and
forming the second feature and not the first feature by the developing of the positive resist after the first and the second irradiation steps, wherein, during the developing, the first region of the positive resist with the image of the first feature is not removed and at the same time the second region of the positive resist with the image of the second feature is removed.

20. The method of claim 19, further comprising:
before the developing of the positive resist, in a third irradiation step, exposing the positive resist with a second pattern generator in accordance with a third dose lower than the first dose, the third irradiation step forming an image of a fourth feature in a third region of the positive resist different from the first and the second regions, wherein the fourth feature is removed during the developing.

21. The method of claim 19, wherein third regions of the positive resist exposed with both the first dose and the second dose are not removed.

22. The method of claim 19, wherein the first irradiation step comprises irradiating with electromagnetic radiation, and wherein the second irradiation step comprises irradiating with a particle radiation.

23. A method for forming a semiconductor device comprising:
applying a negative resist to a substrate, the negative resist being capable of contrast reversal such that the negative resist is configured to be soluble in a developer when irradiated with at least a first dose, the negative resist is configured to be insoluble in the developer when irradiated with a second dose, the negative resist is configured to be soluble in the developer without being irradiated, and wherein the second dose is smaller than the first dose;
in a first irradiation step, exposing the negative resist with the second dose using a mask, the first irradiation step forming an image of a first feature in a first region of the negative resist;
using a pattern generator, in a second irradiation step, exposing the negative resist with the first dose before developing the negative resist, the second irradiation step forming an image of a second feature in a second region over a portion of the first region; and
forming the second feature and the first feature by the developing of the negative resist after the first and the second irradiation steps, wherein, during the developing, a portion of the first region of the negative resist exposed only with the second dose is not removed and at the same time the second region of the negative resist exposed with the first dose is removed.

24. The method of claim 23, further comprising:
before the developing of the negative resist, in a third irradiation step, exposing a third region of the negative resist with the pattern generator in accordance with a third dose lower than the first dose, wherein the third region is different from the second region and different from the portion of the first region of the negative resist exposed only with the second dose, and wherein the negative resist remains on the substrate during development in the third region irradiated with the third dose.

25. The method of claim 23, wherein third regions of the negative resist exposed with the first dose and the second dose are removed during the developing.

26. The method of claim 23, wherein the first irradiation step comprises irradiating with electromagnetic radiation, and wherein the second irradiation step comprises irradiating with a particle radiation.

* * * * *